(12) United States Patent
Milshtein et al.

(10) Patent No.: US 7,879,685 B2
(45) Date of Patent: Feb. 1, 2011

(54) SYSTEM AND METHOD FOR CREATING ELECTRIC ISOLATION BETWEEN LAYERS COMPRISING SOLAR CELLS

(75) Inventors: Erel Milshtein, Cupertino, CA (US);
Benyamin Buller, Cupertino, CA (US)

(73) Assignee: Solyndra, Inc., Fremont, CA (US)

( * ) Notice: Subject to any disclaimer, the term of this patent is extended or adjusted under 35 U.S.C. 154(b) by 636 days.

(21) Appl. No.: 11/881,000

(22) Filed: Jul. 25, 2007

(65) Prior Publication Data

US 2008/0029154 A1    Feb. 7, 2008

Related U.S. Application Data

(63) Continuation-in-part of application No. 11/499,608, filed on Aug. 4, 2006.

(60) Provisional application No. 60/835,724, filed on Aug. 4, 2006.

(51) Int. Cl.
*H01L 21/76* (2006.01)
(52) U.S. Cl. .................. 438/431; 438/460; 438/940; 257/E21.347
(58) Field of Classification Search ............... 438/113, 438/460, 940, 431; 257/E21.347
See application file for complete search history.

(56) References Cited

U.S. PATENT DOCUMENTS

| | | | |
|---|---|---|---|
| 2,984,775 A | 5/1961 | Matlow et al. | |
| 3,005,862 A | 10/1961 | Escoffery | |
| 3,046,324 A | 7/1962 | Matlow | |
| 3,976,508 A | 8/1976 | Milavsky | |
| 3,990,914 A | 11/1976 | Weinstein et al. | |
| 4,113,531 A | 9/1978 | Zanio et al. | |
| RE29,833 E | 11/1978 | Milavsky | |
| 4,292,092 A | 9/1981 | Hanak | |
| 4,292,093 A * | 9/1981 | Ownby et al. | 134/1.3 |

(Continued)

FOREIGN PATENT DOCUMENTS

DE    32 09 548    3/1982

(Continued)

OTHER PUBLICATIONS

International Search Report and Written Opinion dated Feb. 21, 2008 for International Application No. PCT/US2007/017357.

(Continued)

*Primary Examiner*—Zandra Smith
*Assistant Examiner*—Christy L Novacek
(74) *Attorney, Agent, or Firm*—Jones Day; Brett Lovejoy

(57) ABSTRACT

Methods for forming a patterned layer from common layer in a photovoltaic application are provided. The patterned layer is configured to form one or more portions of one or more solar cells on a rigid substrate. A first pass is made with a first laser beam over an area on the common layer. A second pass is made with a second laser beam over approximately the same area on the common layer. The first pass provides a first level of electrical isolation between a first portion and a second portion of the common layer. The second pass provides a second level of electrical isolation between the first portion and the second portion of the common layer. The second level of electrical isolation is greater than the first level of electrical isolation.

48 Claims, 7 Drawing Sheets

U.S. PATENT DOCUMENTS

| | | | |
|---|---|---|---|
| 4,497,974 | A | 2/1985 | Deckman et al. |
| 4,686,323 | A | 8/1987 | Biter et al. |
| 4,726,849 | A | 2/1988 | Murata et al. |
| 4,728,615 | A | 3/1988 | Uchida et al. |
| 4,913,744 | A | 4/1990 | Hoegl et al. |
| 5,093,279 | A | 3/1992 | Andreshak et al. |
| 5,437,736 | A | 8/1995 | Cole |
| 5,735,966 | A | 4/1998 | Luch |
| 5,780,805 | A | 7/1998 | Duncan, Jr. et al. |
| 5,841,099 | A | 11/1998 | Owen et al. |
| 5,902,416 | A | 5/1999 | Kern et al. |
| 5,958,268 | A | 9/1999 | Engelsberg et al. |
| 6,018,123 | A | 1/2000 | Takada et al. |
| 6,066,830 | A * | 5/2000 | Cline et al. ............ 219/121.69 |
| 6,107,564 | A | 8/2000 | Aguilera et al. |
| 6,258,620 | B1 | 7/2001 | Morel et al. |
| 6,294,723 | B2 | 9/2001 | Uematsu et al. |
| 6,355,873 | B1 | 3/2002 | Ishikawa |
| 6,359,210 | B2 | 3/2002 | Ho et al. |
| 6,410,843 | B1 | 6/2002 | Kishi et al. |
| 6,541,695 | B1 | 4/2003 | Mowles |
| 6,544,865 | B1 * | 4/2003 | Basore et al. ............... 438/460 |
| 6,548,751 | B2 | 4/2003 | Sverdrup, Jr. et al. |
| 6,555,739 | B2 | 4/2003 | Kawam |
| 6,706,959 | B2 | 3/2004 | Hamakawa et al. |
| 6,706,963 | B2 | 3/2004 | Gaudiana et al. |
| 6,762,359 | B2 | 7/2004 | Asai et al. |
| 6,806,414 | B2 | 10/2004 | Shiotsuka et al. |
| 6,888,987 | B2 | 5/2005 | Sercel et al. |
| 7,235,736 | B1 | 6/2007 | Buller et al. |
| 2002/0130311 | A1 | 9/2002 | Lieber et al. |
| 2002/0180909 | A1 | 12/2002 | Lubart et al. |
| 2003/0068559 | A1 | 4/2003 | Armstrong et al. |
| 2003/0155003 | A1 | 8/2003 | Tur et al. |
| 2003/0180983 | A1 | 9/2003 | Oswald et al. |
| 2004/0063320 | A1 | 4/2004 | Hollars |
| 2005/0098202 | A1 | 5/2005 | Maltby, Jr. |
| 2005/0271796 | A1 | 12/2005 | Neudecker et al. |

FOREIGN PATENT DOCUMENTS

| | | |
|---|---|---|
| DE | 3801989 | 7/1989 |
| DE | 43 39 547 | 11/1993 |
| DE | 43 43 514 | 12/1993 |
| DE | 44 06 760 | 3/1994 |
| DE | 197 32 876 | 7/1997 |
| DE | 199 33 703 A1 | 10/2000 |
| DE | 103 26 505 A1 | 1/2005 |
| EP | 0 427 934 A | 5/1991 |
| EP | 0 575 848 A | 12/1993 |
| EP | 1 029 959 A | 8/2000 |
| FR | 75 30980 | 10/1975 |
| JP | S59-125670 | 7/1984 |
| JP | S59-143377 | 8/1984 |
| JP | S59-144177 | 8/1984 |
| WO | WO 84/04425 | 11/1984 |
| WO | WO 96/09128 A | 3/1996 |
| WO | WO 00/60655 | 10/2000 |
| WO | WO 02/078896 | 10/2002 |
| WO | WO 03/061013 A | 7/2003 |
| WO | WO 2004/061417 A2 | 7/2004 |
| WO | WO 2005/034149 A2 | 4/2005 |

OTHER PUBLICATIONS

Birkmire et al., 2005, "Cu(InGa)Se$_2$ Solar Cells on a Flexible Polymer Web," Prog. Photovolt 13: 141-148.

Birkmire et al., 1997, "Polycrystalline Thin Film Solar Cells: Present Status and Future Potential, " Annu. Rev. Mater. Sci. 1997 27: 625-653.

Bube, 1998, "Photovoltaic Materials," Properties of Semiconductor Materials 1: 1-277.

Compaan et al., 1998, "Optimization of Laser Scribing for Thin-Film PV Modules," Final Technical Progress Report Apr. 12, 1995-Oct. 11, 1997, National Renewal Energy Laboratory: 38 pages.

Compaan, 2000, "Laser scribing creates monolithic thin-film arrays," Laser Focus World, www. optoelectronics-world.com Jan. 2000: 147-152.

Chaisitak et al., 2000, "Improvement in Performances of ZnO:B/i-ZnO/Cu(InGa)Se$_2$ Solar Cells by Surface Treatments for Cu(InGa)Se$_2$," The Japan Society of Applied Physics 39: 1660-1664.

Collares-Pereira et al., 1989, "Amorphous Silicon Photovoltaic Solar Cells—Inexpensive, High-Yield Optical Designs," ASME 111: 112-116.

Cuevas et al., 1982, "50 Per Cent More Output Power from an Albedo-collecting Flat Panel Using Bifacial Solar Cells," Solar Energy 29: 419-420.

Edmonds, 1990, "The Performance of Bifacial Solar Cells in Static Solar Concentrators," Solar Energy Materials 21: 173-190.

Golay et al., "Laser Scribing of p-i-n/p-i-n "Miormorph" (a-Si:H/μc-Si:H) Tandem Cells," Abstract, www-micromorph.unine.ch/publications/PS_files/paper_319.pdf, 2000.

Jensen et al., 2003, "Back Contact Cracking During Fabrication of CIGS Solar Cells on Polyimide Substrates," NREL/CD, 877-881.

Jiang et al., 2003, Femtosecond Lasers Ablation: Challenges and Opportunities, Department of Mechanical and Aerospace Engineering and Engineering Mechanics, University of Missouri-Rolla, Rolla, Missouri, web.umr.edu/~laser/paper/femtosecond_rev_NSFWorkshop.pdf : 1-15.

Joliet et al., 1985, "Laser-induced Synthesis of Thin CuInSe_2 Films," Appl. Phys. Lett. 46: 266-267.

Khosrofian et al., 1983, "Measurement of a Gaussian Laser Beam Diameter Through the Direct Inversion of Knife-edge Data," Applied Optics 22: 3406-3410.

Lambin et al., 1983, "Complete calculation of the electric potential produced by a pair of current source and sink energizing a circular finite-length cylinder," J. Appl. Phys. 54(7): 4174-4184.

Lugue, 1984, "Static Concentrators: A Venture to Meet the Low Cost Target in Photovoltaics," Solar Cells 12: 141-145.

Lugue, 1984-1985, "Diffusing Reflectors for Bifacial Photovoltaic Panels," Solar Cells 13: 277-292.

Lugue et al., 2003, "Handbook of Photovoltaic Science and Engineering," Wiley, 1-662.

Malbranche et al., 2000-2001, "The Three Ways to Exploit Solar Energy," CLEFS CEA No. 44: 25-37.

Oria et al., 1985, "Improvement of the Albedo Collecting Effect by Varying the Rotation Axis in a Bifacial Polar Tracker," Proc. Melecon vol. IV: 125-128.

Osterwald et al., 2003, "Accelerated Stress Testing of Thin-Film Modules with SnO$_2$:F Transparent Conductors," Presented at the National Center for Photovoltaics and Solar Program Review Meeting, Denver, CO Mar. 24-26, 2003: 5 pages.

Osterwald, et al., "Electrochemical Corrosion of SnO$_2$:F Transparent Conducting Layers in Thin Film Photovoltaic Modules, " Abstract National Renewable Energy Laboratory, www.nrel.gov/ncpv/thin_film/docs/sno_paper.pdf 22 pages, Aug. 2003.

Otoma et al., 1991, "Growth of CuGaS$_2$ by Alternating-source-feeding MOVPE," Journal of Crystal Growth 115: 807-810.

Pandy et al., 1996, "Handbook of Semiconductor Electrodeposition," Applied Physics: 1-285.

Rabl 1981, "Yearly Average Performance of the Principal Solar Collector Types," Solar Energy vol. 27. No. 3: 215-233.

Romeo, 2002, "Growth and Characterization of High Efficiency CdTe/CDS Solar Cells," Dissertation submitted to the Swiss Federal Institute of Technology Zurich: 1-103.

Sala et al., 1983, "Albedo Collecting Photovoltaic Bifacial Panels," 5$^{th}$ E.C. Photovoltaic Solar Energy Conference, Athens, Greece: 565-567.

Sang et al., 2001, "Performance Improvement of CIGS-based Modules by Depositing High-quality Ga-doped ZnO Windows with Magnetron Sputtering," Solar Energy Materials & Solar Cells 67: 237-245.

Simpson et al., 2004, "Manufacturing Process Advancements for Flexible CIGS PV on Stainless Foil," Major FY Publications.

Stolt et al., 1994, "CIS Solar Cells with ZnO Windows Deposited by ALE," IEEE, 250-253.

Tech Specs-Advanced Technology today, 2001, "Thick and thin Film Lasered Substrates," www.coorstek.com 10 pages.

Uematsu et al., 2001, "Design and Characterization of Flat-Plate Static-Concentrator Photovoltaic Modules," Solar Energy Materials & Solar Cells 67:441-448.

Uematsu et al., 2001, "Fabrication and Characterization of a Flat-Plate Static-Concentrator Photovoltaic Module," Solar Energy Materials & Solar Cells 67:425-434.

Veiko, 2001, "Laser microshaping: Fundamentals, practical applications, and future prospects," RIKEN REview No. 32 (Jan. 2001): Focused on Laser Precision Microfabrication: 11-18.

Website http://www.agr.gc.ca/pfra/water/solar_e.htm, "Solar Powered Water Pumping Systems for Livestock Watering" from Jul. 1, 2003, available from www.archive.org. 5 pages.

Wennerberg et al., 2001, "Design of grided Cu(In,Ga)Se$_2$ thin-film PV modules," Solar Energy Materials & Solar Cells 67 (2001) : 59-65.

Yamamoto, 2003, "Cutting Edge 2—Thin-film crystalline silicon solar cells," ISAP International No. 7: 12-19.

Yao et al., Nov. 24, 2004, "Time scale effects in laser material removal: a review," Int J Adv Manuf. Technol. 11 pages.

Compaan et al., 2000, "Laser scribing of polycrystalline thin films," Optics and Lasers in Engineering 34: 15-45.

Compaan et al., 1998, "Lasers and Beam Delivery Options for Polycrystalline Thin-Film Scribing," AIP Conference Proceedings of the 15$^{th}$ Conference Denver, Colorado, Sep. 1998 462:42-47.

Compaan et al., 1996, "Pulse Duration and Wavelength Effects in Laser Scribing of Thin-Film Polycrystalline PV Materials," AIP Conference Proceedings of the 14$^{th}$ Conference Lakewood, Colorado, Nov. 1996 364:567-571.

Matulionis et al., 1997, "Wavelength and Pulse Duration Effects in Laser Scribing of Thin Films," Conference Record of the 26$^{th}$ IEEE Photovoltaic Specialists Anaheim, CA Sep. 1997: 491-494.

Pirozzi et al., 1995, "A Laser System for Silicon Solar Cell Processing: Design, Set-up and Operation," Materials Science Forum vols. 173-174: 319-324.

* cited by examiner

SYSTEM AND METHOD FOR CREATING ELECTRIC ISOLATION BETWEEN LAYERS COMPRISING SOLAR CELLS

CROSS-REFERENCE TO RELATED APPLICATIONS

This application claims benefit under 35 U.S.C. §119(e), of U.S. Provisional Patent Application No. 60/835,724, filed on Aug. 4, 2006, which is hereby incorporated by reference herein in its entirety. Furthermore, this application is a Continuation-In-Part of U.S. patent application Ser. No. 11/499,608, filed Aug. 4, 2006, which is hereby incorporated by reference herein in its entirety.

FIELD

This application is directed to the laser scribing of layers in solar cells. In particular, it is directed to delineating devices and functions within the solar cell using multiple passes of a laser.

DESCRIPTION OF THE FIGURES

The accompanying drawings, which are incorporated into and constitute a part of this specification, illustrate one or more embodiments of the present invention and, together with the detailed description, serve to explain the principles and implementations of the invention.

DETAILED DESCRIPTION

Embodiments of the present invention are described herein in the context of a system and method for creating electric isolation between layers comprising solar cells. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
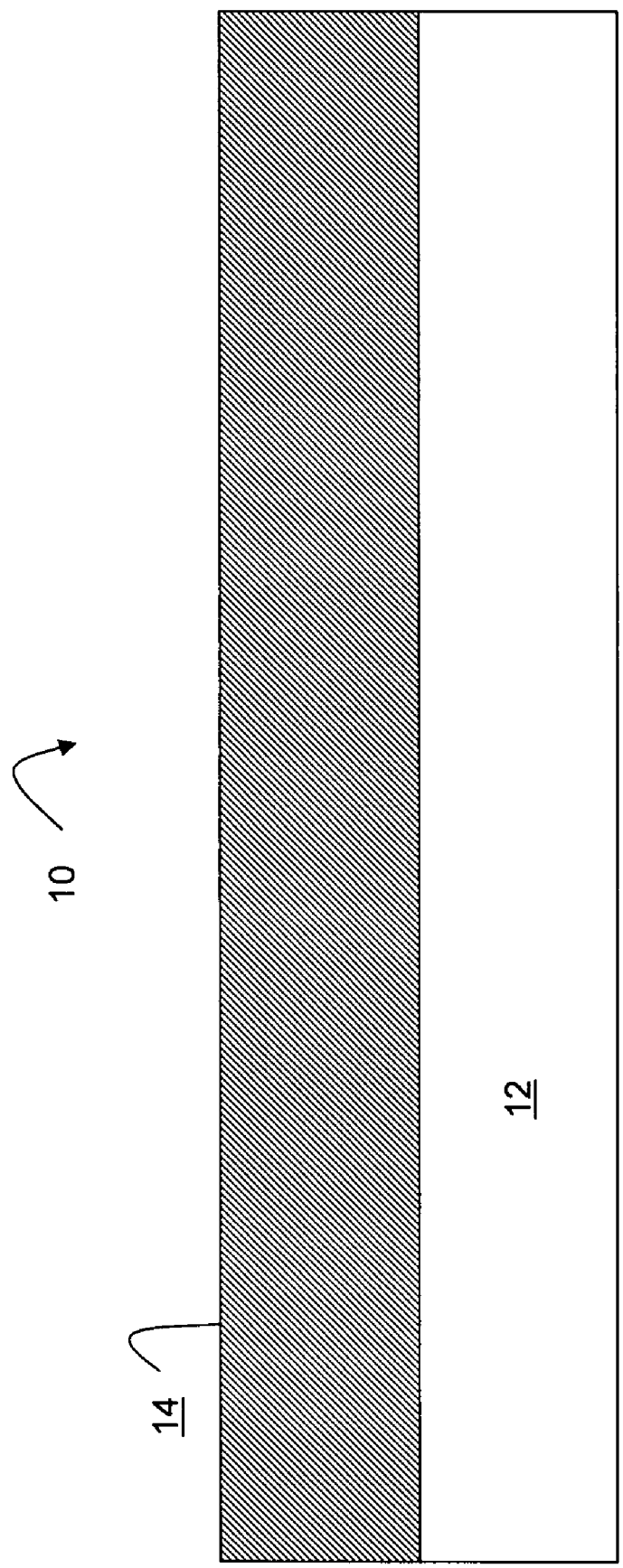
FIGS. 1a-c are side views detailing an exemplary generation of a solar cell.
Figure 1B:
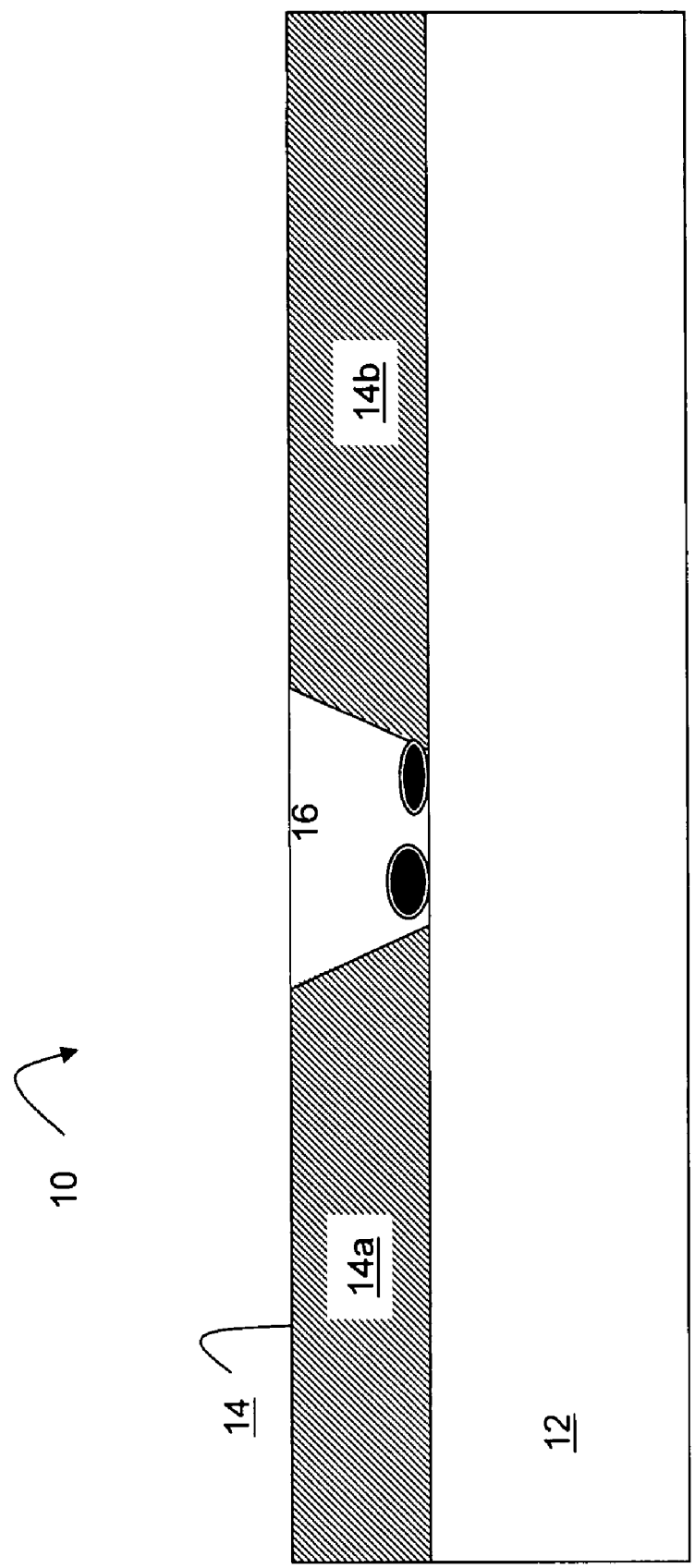
Figure 1C:
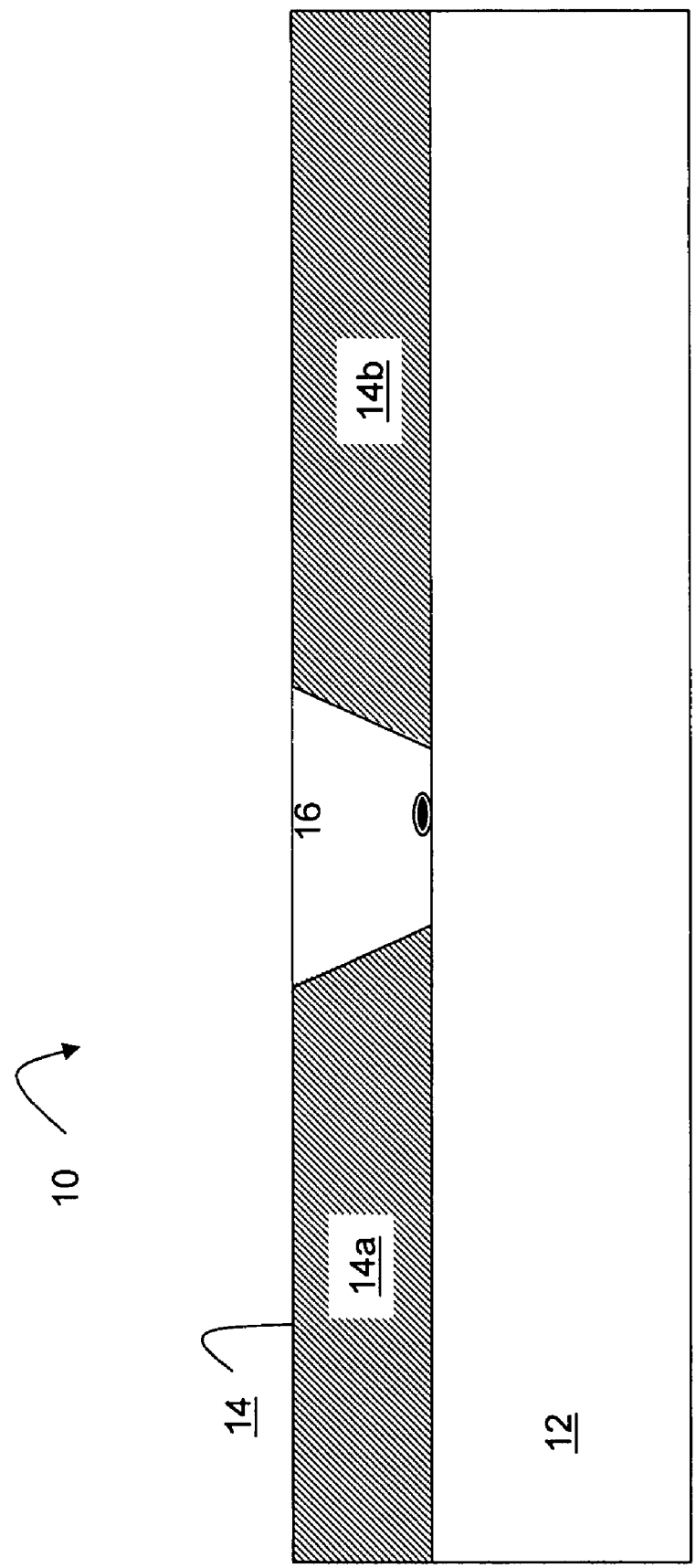

FIGS. 1a-c are side views detailing an exemplary generation of a solar cell. FIG. 1a is a side view of a solar cell showing the preliminary composition of a generic solar cell. A solar cell 10 has a rigid substrate 12, upon which a layer of material 14 has been placed. This layer 14 can be placed on the rigid substrate 12 using various means of manufacture, including many semiconductor fabrication techniques. Layer 14 can be of various thicknesses, depending upon the manner in which the layer has been placed upon the rigid substrate.

In practice, layer 14 is typically a conductive layer in a solar cell, which serves as one electrode in the makeup of the solar cell. However, in this application, the particular layer that layer 14 represents is demonstrative in nature. Accordingly, for the purposes of this application, layer 14 can be a conductive layer, an intrinsic layer, a semiconductor layer, or any other type of layer that could be formed on a rigid substrate using semiconductor manufacturing methods.

Rigid substrate 12 in this example is glass, but again this is demonstrative in nature. For the purposes of this application, rigid substrate 12 can be any material that is used, or will be used in the future, as a rigid substrate in a semiconductor manufacturing process.

In FIG. 1b, a first pass has been made with a laser beam over an area of layer 14. In many uses, the laser beam can be applied to the top layer, which will cause the material in layer 14 to be rejected from the main mass of solar cell 10. The energy imparted to layer 14 can cause the material in the layer 14 to boil, vaporize, or explode away from the main mass of solar cell 10. This expulsion of material from layer 14 forms a groove or trench 16 in layer 14. In terms of conductive or semiconductor materials, this removal of material also results in an electrical isolation between portions of the material, in this diagram portions 14a and 14b, respectively.

However, the cut in the material may not prove to be effective to produce as good an electrical isolation as needed between portions 14a and 14b. For example, portions of the material may absorb the energy of the laser beam in the first pass and liquefy without vaporizing. In this case, the molten material may reform at the bottom of the trench 16. Or, molten material from the sides of the layer 14 may flow into the trench 16. Or, the laser pass may involve multiple pulses at differing points on the solar cell 10. In this case, the pulses could produce crater-like results in layer 14, which effectively act as a first rough electrical isolation step between portions 14a and 14b.

In one case, the first laser pass can be applied from the underside of rigid substrate 12. In this case, layer 14 melts and forms a pool of molten material underneath the top surface of material 14. After sufficient application of the first laser beam pass, molten material 14 explodes through the surface of layer 14. In this case, both solid and molten ejecta could fall back into the now-cleaved trench.

In short, the first laser beam pass produces trench 16, but remnants of layer 14 may pollute the trench 16 created in the material. Or, the laser process could be somewhat incomplete, again leaving remnants of material 14 in trench 16. These remnants of material 14 could create electrical pathways through the trench 16, thus resulting in a lower overall electrical resistance or higher conductance through the trench 14.

In FIG. 1c, a second laser beam pass has been made. In this case, the second laser beam pass has removed a portion of the detritus and ejecta produced by the first laser beam pass. In this manner, the remains of the first laser beam pass are removed by the laser beam pass, thus increasing the level of electrical isolation between portions 14a and 14b.

Figure 2A:
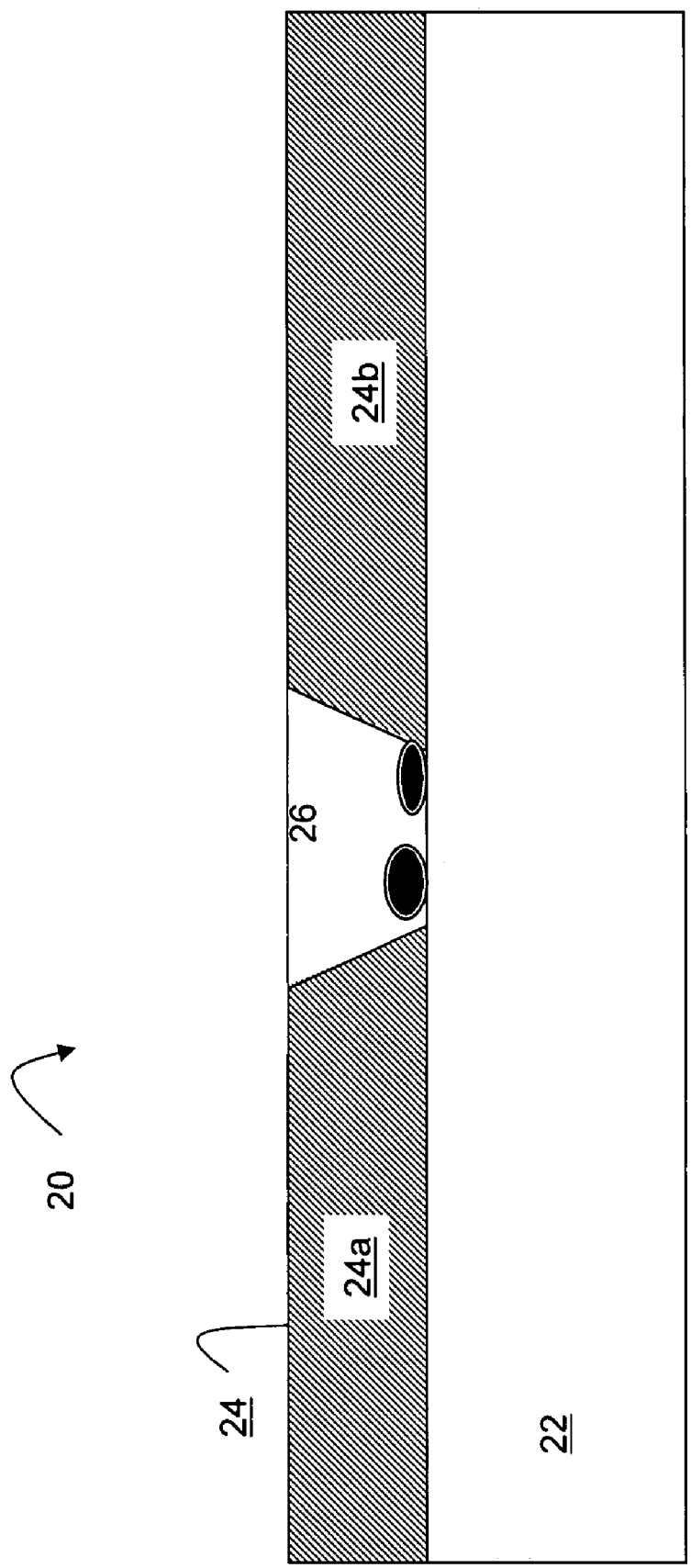
FIGS. 2a-b detail the method being applied to a layer disposed upon another layer within a solar cell.
Figure 2B:
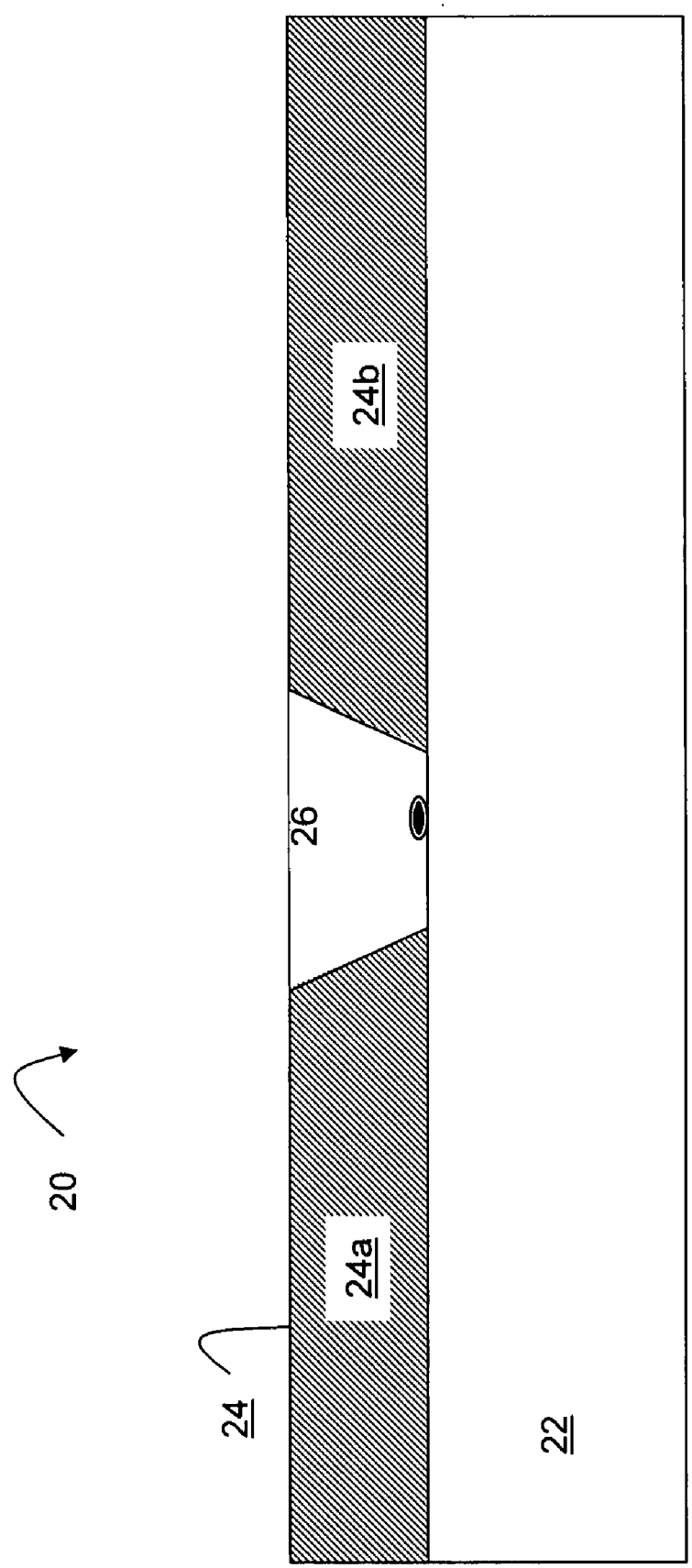

FIGS. 2a-b detail the method being applied to a layer disposed upon another layer within a solar cell. As can be gleaned, embodiments could be applied to more than one layer, or a layer sitting on top of another layer as well. FIGS. 2a-b show a trench on a topmost layer 24 on a solar cell 20 after being cut through by a first laser beam pass and after a subsequent laser beam pass. The cutting process can either leave remnants of the topmost layer 24, remnants of the relatively untouched bottom layer 22, or both, within trench 26. This is shown in FIG. 2a. In FIG. 2b, a second laser beam pass has removed a portion of the remnants, thus increasing the electrical isolation between portions 24a and 24b.

Figure 3A:
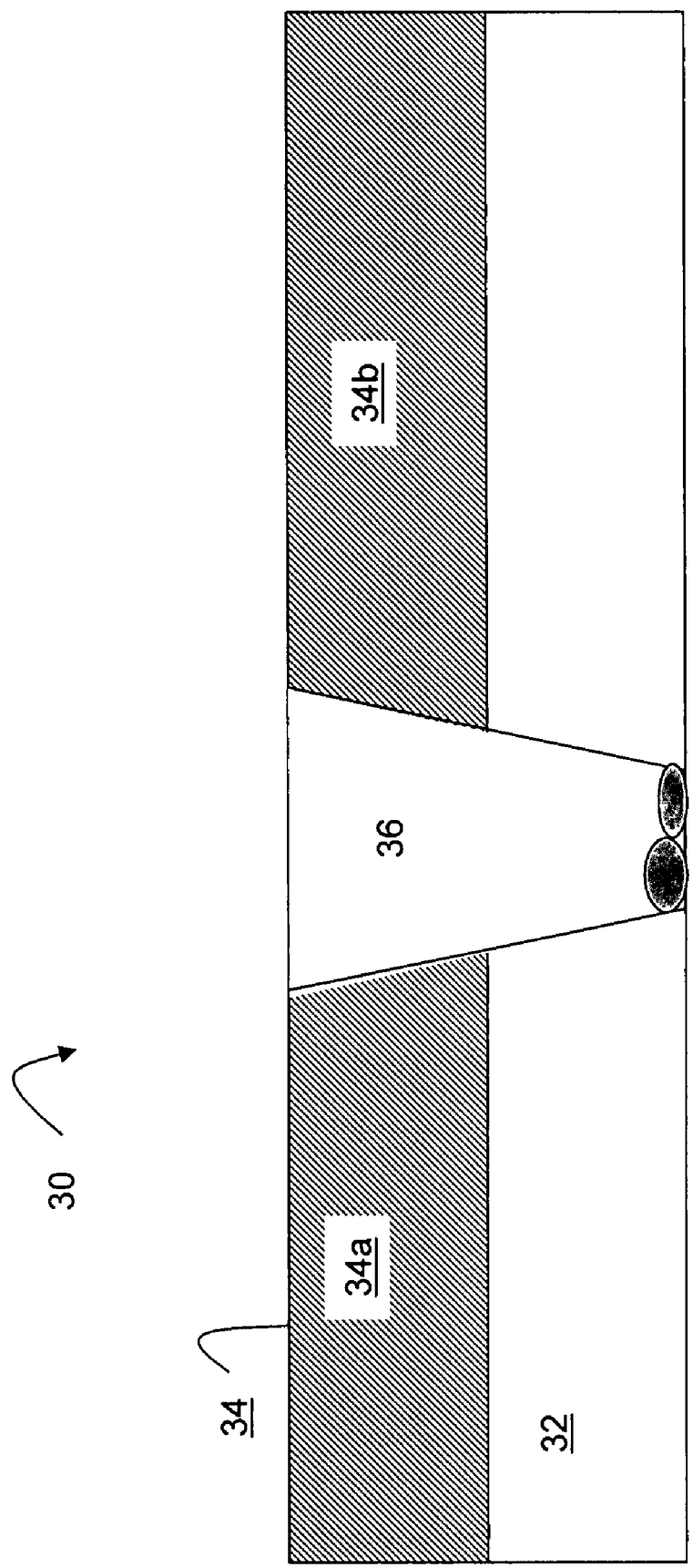
FIGS. 3a-b detail the method being applied to multiple layers disposed upon a rigid substrate within a solar cell.
Figure 3B:
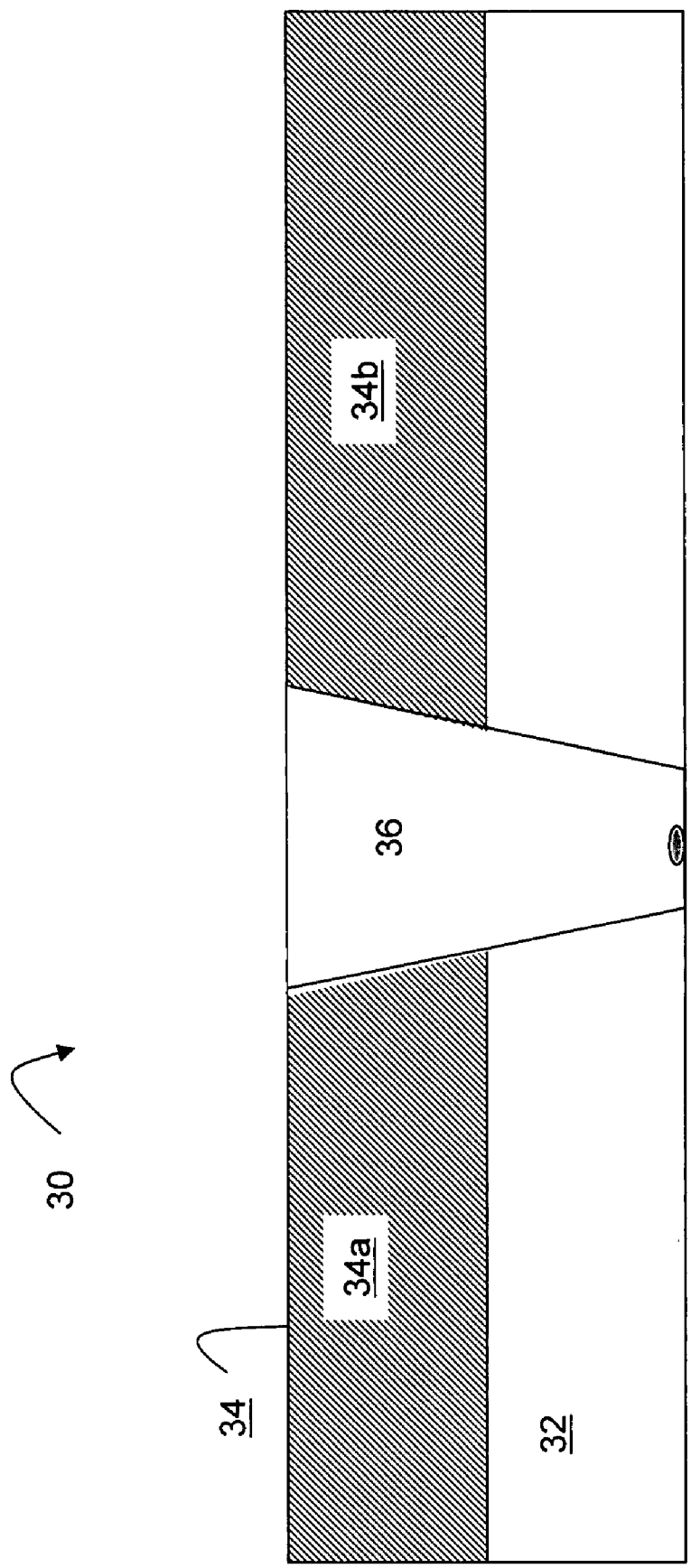

FIGS. 3a-b detail the method being applied to multiple layers disposed upon a rigid substrate within a solar cell. In this case, a trench can be cut through a first layer 34 and a second layer 32 on a solar cell 30. The cutting process can either leave remnants of the topmost layer 34, remnants of bottom layer 32, or both, within the trench 36. This is shown in FIG. 3a. In FIG. 3b, a second laser beam pass has removed a portion of the remnants, thus increasing the electrical isolation between portions 34a and 34b, and/or portions 32a and 32b of layer 34.

The laser used in the first laser beam pass or the second laser beam pass can be of any variety used to created isolative trenches in semiconductor materials, and can be of the pulse-variety as well. The second pass may be carried out by the same laser that was applied with the first path at the same or with different energies and/or beam properties. Or, the laser used in the second pass can be another laser with completely differing, similar, or identical characteristics to the first laser. The energies applied to the materials can be of any variety used to created isolative trenches in semiconductor materials. The number of subsequent passes can be of any number, although only one is detailed in this application. Further, any of the first pass or the subsequent passes can be made from the top or the bottom of the mass of material.

In some embodiments, the substrate on which the one or more layers to be patterned is rigid. Rigidity of a material can be measured using several different metrics including, but not limited to, Young's modulus. In solid mechanics, Young's Modulus (E) (also known as the Young Modulus, modulus of elasticity, elastic modulus or tensile modulus) is a measure of the stiffness of a given material. It is defined as the ratio, for small strains, of the rate of change of stress with strain. This can be experimentally determined from the slope of a stress-strain curve created during tensile tests conducted on a sample of the material. Young's modulus for various materials is given in the following table.

| Material | Young's modulus (E) in GPa | Young's modulus (E) in lbf/in² (psi) |
| --- | --- | --- |
| Rubber (small strain) | 0.01-0.1 | 1,500-15,000 |
| Low density polyethylene | 0.2 | 30,000 |
| Polypropylene | 1.5-2 | 217,000-290,000 |
| Polyethylene terephthalate | 2-2.5 | 290,000-360,000 |
| Polystyrene | 3-3.5 | 435,000-505,000 |
| Nylon | 3-7 | 290,000-580,000 |
| Aluminum alloy | 69 | 10,000,000 |
| Glass (all types) | 72 | 10,400,000 |
| Brass and bronze | 103-124 | 17,000,000 |
| Titanium (Ti) | 105-120 | 15,000,000-17,500,000 |
| Carbon fiber reinforced plastic (unidirectional, along grain) | 150 | 21,800,000 |
| Wrought iron and steel | 190-210 | 30,000,000 |
| Tungsten (W) | 400-410 | 58,000,000-59,500,000 |
| Silicon carbide (SiC) | 450 | 65,000,000 |
| Tungsten carbide (WC) | 450-650 | 65,000,000-94,000,000 |
| Single Carbon nanotube | 1,000+ | 145,000,000 |
| Diamond (C) | 1,050-1,200 | 150,000,000-175,000,000 |

In some embodiments of the present application, a material (e.g., a substrate) is deemed to be rigid when it is made of a material that has a Young's modulus of 20 GPa or greater, 30 GPa or greater, 40 GPa or greater, 50 GPa or greater, 60 GPa or greater, or 70 GPa or greater. In some embodiments of the present application a material (e.g., the substrate) is deemed to be rigid when the Young's modulus for the material is a constant over a range of strains. Such materials are called linear, and are said to obey Hooke's law. Thus, in some embodiments, the substrate is made out of a linear material that obeys Hooke's law. Examples of linear materials include, but are not limited to, steel, carbon fiber, and glass. Rubber and soil (except at very low strains) are non-linear materials.

The present application is not limited to substrates that have rigid cylindrical shapes or are solid rods, or are flat planar. All or a portion of the substrate can be characterized by a cross-section bounded by any one of a number of shapes other than circular. The bounding shape can be any one of circular, ovoid, or any shape characterized by one or more smooth curved surfaces, or any splice of smooth curved surfaces. The bounding shape can be an n-gon, where n is 3, 5, or greater than 5. The bounding shape can also be linear in nature, including triangular, rectangular, pentangular, hexagonal, or having any number of linear segmented surfaces. Or, the cross-section can be bounded by any combination of linear surfaces, arcuate surfaces, or curved surfaces. As described herein, for ease of discussion only, an omnifacial circular cross-section is illustrated to represent nonplanar embodiments of the photovoltaic device. However, it should be noted that any cross-sectional geometry may be used in a photovoltaic device 10 that is nonplanar in practice.

In some embodiments, a first portion of the substrate is characterized by a first cross-sectional shape and a second portion of the substrate is characterized by a second cross-sectional shape, where the first and second cross-sectional shapes are the same or different. In some embodiments, at least ten percent, at least twenty percent, at least thirty percent, at least forty percent, at least fifty percent, at least sixty percent, at least seventy percent, at least eighty percent, at least ninety percent or all of the length of the substrate 102 is characterized by the first cross-sectional shape. In some embodiments, the first cross-sectional shape is planar (e.g., has no arcuate side) and the second cross-sectional shape has at least one arcuate side.

In some embodiments, the substrate is made of a rigid plastic, metal, metal alloy, or glass. In some embodiments, the substrate is made of a urethane polymer, an acrylic polymer, a fluoropolymer, polybenzamidazole, polyimide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene. In some embodiments, the substrate 102 is made of aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass.

In some embodiments, the substrate is made of a material such as polybenzamidazole (e.g., CELAZOLE®, available from Boedeker Plastics, Inc., Shiner, Tex.). In some embodiments, the substrate 102 is made of polymide (e.g., DUPONT™ VESPEL®, or DUPONT™ KAPTON®, Wilmington, Del.). In some embodiments, the substrate is made of polytetrafluoroethylene (PTFE) or polyetheretherketone (PEEK), each of which is available from Boedeker Plastics, Inc. In some embodiments, the substrate is made of polyamide-imide (e.g., TORLON® PAI, Solvay Advanced Polymers, Alpharetta, Ga.).

In some embodiments, the substrate is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, the substrate 102 is a phenoloic laminate having a NEMA grade of G-3, G-5, G-7, G-9, G-10 or G-11. Exemplary phenolic laminates are available from Boedeker Plastics, Inc.

In some embodiments, the substrate is made of polystyrene. Examples of polystyrene include general purpose polystyrene and high impact polystyrene as detailed in Marks' *Standard Handbook for Mechanical Engineers*, ninth edition, 1987, McGraw-Hill, Inc., p. 6-174, which is hereby incorporated by reference herein in its entirety. In still other embodiments, the substrate 102 is made of cross-linked polystyrene. One example of cross-linked polystyrene is REXOLITE® (available from San Diego Plastics Inc., National City, Calif.). REXOLITE is a thermoset, in particular a rigid and translucent plastic produced by cross linking polystyrene with divinylbenzene.

In still other embodiments, the substrate is made of polycarbonate. Such polycarbonates can have varying amounts of glass fibers (e.g., 10%, 20%, 30%, or 40%) in order to adjust tensile strength, stiffness, compressive strength, as well as the thermal expansion coefficient of the material. Exemplary polycarbonates are ZELUX® M and ZELUX® W, which are available from Boedeker Plastics, Inc.

In some embodiments, the substrate is made of polyethylene. In some embodiments, the substrate is made of low density polyethylene (LDPE), high density polyethylene (HDPE), or ultra high molecular weight polyethylene (UHMW PE). Chemical properties of HDPE are described in Marks' *Standard Handbook for Mechanical Engineers*, ninth edition, 1987, McGraw-Hill, Inc., p. 6-173, which is hereby incorporated by reference herein in its entirety. In some embodiments, the substrate is made of acrylonitrile-butadiene-styrene, polytetrafluoro-ethylene (Teflon), polymethacrylate (lucite or plexiglass), nylon 6,6, cellulose acetate butyrate, cellulose acetate, rigid vinyl, plasticized vinyl, or polypropylene. Chemical properties of these materials are described in Marks' *Standard Handbook for Mechanical Engineers*, ninth edition, 1987, McGraw-Hill, Inc., pp. 6-172 through 6-175, which is hereby incorporated by reference in its entirety.

Additional exemplary materials that can be used to form the substrate are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), *Plastics*, Morgan-Grampiand, Ltd., 2 vols. 1970; Tobolsky and Mark (eds.), *Polymer Science and Materials, Wiley,* 1971; Glanville, *The Plastics's Engineer's Data Book*, Industrial Press, 1971; Mohr (editor and senior author), Oleesky, Shook, and Meyers, *SPI Handbook of Technology and Engineering of Reinforced Plastics Composites*, Van Nostrand Reinhold, 1973, each of which is hereby incorporated by reference herein in its entirety.

In some embodiments, a cross-section of the substrate is circumferential and has an outer diameter of between 3 mm and 100 mm, between 4 mm and 75 mm, between 5 mm and 50 mm, between 10 mm and 40 mm, or between 14 mm and 17 mm. In some embodiments, a cross-section of the substrate is circumferential and has an outer diameter of between 1 mm and 1000 mm.

In some embodiments, the substrate is a tube with a hollowed inner portion. In such embodiments, a cross-section of the substrate is characterized by an inner radius defining the hollowed interior and an outer radius. The difference between the inner radius and the outer radius is the thickness of the substrate. In some embodiments, the thickness of the substrate is between 0.1 mm and 20 mm, between 0.3 mm and 10 mm, between 0.5 mm and 5 mm, or between 1 mm and 2 mm. In some embodiments, the inner radius is between 1 mm and 100 mm, between 3 mm and 50 mm, or between 5 mm and 10 mm.

In some embodiments, the substrate has a length that is between 5 mm and 10,000 mm, between 50 mm and 5,000 mm, between 100 mm and 3000 mm, or between 500 mm and 1500 mm. In one embodiment, the substrate is a hollowed tube having an outer diameter of 15 mm and a thickness of 1.2 mm, and a length of 1040 mm. Although the substrate is a solid in some embodiments, it will be appreciated that in many embodiments, the substrate will have a hollow core and will adopt a rigid tubular structure such as that formed by a glass tube.

One aspect of the present application provides a method for forming a patterned layer from common layer in a photovoltaic application, wherein the patterned layer is configured to form one or more portions of one or more solar cells on a rigid substrate. For example, in FIG. 1C, common layer 14 is patterned to form portions 14a and 14b. Portions 14a and 14b are configured to form one or more portions of one or more solar cells. For example, portions 14a and 14b could respectively be the back-electrode of a first and second solar cell that is monolithically integrated onto substrate 12. In another example, turning to FIG. 2b, portions 24a and 24b could respectively be the semiconductor junction of a first and second solar cell that is monolithically integrated onto a substrate that is not shown. In still another example, referring to FIG. 2b, portions 24a and 24b could respectively be the transparent conducting layer (e.g., transparent conducting oxide) of a first and second solar cell that is monolithically integrated onto a substrate that is not shown. In the exemplary method, a first pass with a first laser beam is made over an area on the common layer. Than, a second pass is made with a second laser beam over approximately the same area on the common layer. The first pass provides a first level of electrical isolation between a first portion and a second portion of the common layer. The second pass provides a second level of electrical isolation between the first portion and the second portion of the common layer, the second level of electrical isolation being greater than the first level of electrical isolation.

In some embodiments the second pass comprises a plurality of laser beam passes. In some embodiments, the first laser beam and the second laser beam are generated by a common laser apparatus. In some embodiments, the first laser beam and the second laser beam are each generated by a different laser apparatus. In some embodiments, the first laser beam or the second laser beam is generated by a pulsed laser. In some embodiments, the pulsed laser has a pulse frequency in the range of 0.1 kilohertz (kHz) to 1,000 kHz during a portion of the first pass or a portion of the second pass. In some embodiments, a dose of radiant energy in a range from 0.01 Joules per square centimeters (J/cm$^2$) to 50.0 j/cm$^2$ is delivered during a portion of the first pass or a portion of the second pass. In some embodiments, the common layer is a conductive layer. In some embodiments, the conductive layer comprises aluminum, molybdenum, tungsten, vanadium, rhodium, niobium, chromium, tantalum, titanium, steel, nickel, platinum, silver, gold, an alloy thereof, or any combination thereof. In some embodiments, the conductive layer comprises indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic.

Thus, systems and methods for creating electric isolation between layers comprising solar cells is described and illustrated. Those skilled in the art will recognize that many modifications and variations of the present invention are possible without departing from the invention. Additionally, it is understood that the method could be applied to production of semiconductors in general Of course, the various features depicted in each of the Figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

We claim:

1. A method for forming a patterned layer from a common layer in a photovoltaic application, wherein the patterned layer is configured to form one or more portions of one or more solar cells on a rigid substrate, the method comprising:
   making a first pass with a first laser beam over an area on the common layer; and
   making a second pass with a second laser beam over approximately the same area on the common layer, wherein
   the first pass provides a first level of electrical isolation between a first portion and a second portion of the common layer;
   the second pass provides a second level of electrical isolation between the first portion and the second portion of the common layer, the second level of electrical isolation being greater than the first level of electrical isolation; and
   said substrate has a Young's modulus of 20 GPa or greater.

2. The method of claim 1, wherein the second pass comprises a plurality of laser beam passes.

3. The method of claim 1, wherein the first laser beam and the second laser beam are generated by a common laser apparatus.

4. The method of claim 1, wherein the first laser beam and the second laser beam are each generated by a different laser apparatus.

5. The method of claim 1, wherein the first laser beam or the second laser beam is generated by a pulsed laser.

6. The method of claim 5, wherein the pulsed laser has a pulse frequency in the range of 0.1 kilohertz (kHz) to 1,000 kHz during a portion of the first pass or a portion of the second pass.

7. The method of claim 1, wherein a dose of radiant energy in a range from 0.01 Joules per square centimeters (J/cm$^2$) to 50.0 J/cm$^2$ is delivered during a portion of the first pass or a portion of the second pass.

8. The method of claim 1, wherein the common layer is a conductive layer.

9. The method of claim 8, wherein the conductive layer comprises aluminum, molybdenum, tungsten, vanadium, rhodium, niobium, chromium, tantalum, titanium, steel, nickel, platinum, silver, gold, an alloy thereof, or any combination thereof.

10. The method of claim 9, wherein the conductive layer comprises indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic.

11. The method of claim 1, wherein said substrate has a Young's modulus of 40 GPa or greater.

12. The method of claim 1, wherein said substrate has a Young's modulus of 70 GPa or greater.

13. The method of claim 1, wherein said substrate is made of a linear material.

14. The method of claim 1, wherein all or a portion of the substrate is a rigid tube or a rigid solid rod.

15. The method of claim 1, wherein all or a portion of the substrate is characterized by a circular cross-section, an ovoid cross-section, a triangular cross-section, a pentangular cross-section, a hexagonal cross-section, a cross-section having at least one arcuate portion, or a cross-section having at least one curved portion.

16. The method of claims 1, wherein a first portion of the substrate is characterized by a first cross-sectional shape and a second portion of the substrate is characterized by a second cross-sectional shape.

17. The method of claim 16, wherein the first cross-sectional shape and the second cross-sectional shape are the same.

18. The method of claim 16, wherein the first cross-sectional shape and the second cross-sectional shape are different.

19. The method of claim 16, wherein at least sixty percent of the length of the substrate is characterized by the first cross-sectional shape.

20. The method of claim 16, wherein the first cross-sectional shape is planar and the second cross-sectional shape has at least one arcuate side.

21. A method for forming a patterned layer from a common layer in a photovoltaic application, wherein the patterned layer is configured to form one or more electrically isolated layers of material on a substrate, the method comprising:
   making a first laser beam pass with a first laser beam over a first area on the common layer;
   based on the step of making a first pass, removing a first amount of the common layer;
   making a second laser beam pass with a second laser beam over a second area on the common layer, wherein the second area on the common layer is approximately the same as the first area on the common layer,
   based on the step of making a second pass, removing a second amount of the common layer, the second amount of the common layer comprising either: a) portions of the common layer left after the first pass, or b) remnants of the first amount that resettle within the area; wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation; and wherein said substrate has a Young's modulus of 20 GPa or greater.

22. The method of claim 21, wherein the second laser beam pass comprises a plurality of laser beam passes.

23. The method of claim 21, wherein the first laser beam and the second laser beam are generated by a common laser apparatus.

24. The method of claim 21, wherein the first laser beam and the second laser beam are each generated by a different laser apparatus.

25. The method of claim 21, wherein the first laser beam or the second laser beam is generated by a pulsed laser.

26. The method of claim 25, wherein the pulsed laser has a pulse frequency in the range of 0.1 kilohertz (kHz) to 1,000 kHz during a portion of the first pass or a portion of the second pass.

27. The method of claim 21, wherein a dose of radiant energy in a range from 0.01 Joules per square centimeters ($J/cm^2$) to 50.0 $J/cm^2$ is delivered during a portion of the first laser beam pass or a portion of the second laser beam pass.

28. The method of claim 21, wherein the common layer is a conductive layer.

29. The method of claim 28, wherein the conductive layer comprises aluminum, molybdenum, tungsten, vanadium, rhodium, niobium, chromium, tantalum, titanium, steel, nickel, platinum, silver, gold, an alloy thereof, or any combination thereof.

30. The method of claim 28, wherein the conductive layer comprises indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic.

31. The method of claim 21, wherein said substrate has a Young's modulus of 40 GPa or greater.

32. The method of claim 21, wherein said substrate has a Young's modulus of 70 GPa or greater.

33. The method of claim 21, wherein said substrate is made of a linear material.

34. The method of claim 21, wherein all or a portion of the substrate is a rigid tube or a rigid solid rod.

35. The method of claim 21, wherein all or a portion of the substrate is characterized by a circular cross-section, an ovoid cross-section, a triangular cross-section, a pentangular cross-section, a hexagonal cross-section, a cross-section having at least one arcuate portion, or a cross-section having at least one curved portion.

36. The method of claims 21, wherein a first portion of the substrate is characterized by a first cross-sectional shape and a second portion of the substrate is characterized by a second cross-sectional shape.

37. The method of claim 36, wherein the first cross-sectional shape and the second cross-sectional shape are the same.

38. The method of claim 36, wherein the first cross-sectional shape and the second cross-sectional shape are different.

39. The method of claim 36, wherein at least sixty percent of the length of the substrate is characterized by the first cross-sectional shape.

40. The method of claim 36, wherein the first cross-sectional shape is planar and the second cross-sectional shape has at least one arcuate side.

41. A method for forming a patterned layer from a common layer in a photovoltaic application, wherein the patterned layer is configured to form one or more portions of one or more solar cells on a rigid substrate, the method comprising:

making a first pass with a first laser beam over an area on the common layer; and making a second pass with a second laser beam over approximately the same area on the common layer, wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation; and all or a portion of the substrate is a rigid tube or a rigid solid rod.

42. A method for forming a patterned layer from a common layer in a photovoltaic application, wherein the patterned layer is configured to form one or more portions of one or more solar cells on a rigid substrate, the method comprising:

making a first pass with a first laser beam over an area on the common layer; and making a second pass with a second laser beam over approximately the same area on the common layer, wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation; and all or a portion of the substrate is characterized by a circular cross-section, an ovoid cross-section, a triangular cross-section, a pentangular cross-section, a hexagonal cross-section, a cross-section having at least one arcuate portion, or a cross-section having at least one curved portion.

43. A method for forming a patterned layer from a common layer in a photovoltaic application, wherein the patterned layer is configured to form one or more portions of one or more solar cells on a rigid substrate, the method comprising:

making a first pass with a first laser beam over an area on the common layer; and making a second pass with a second laser beam over approximately the same area on the common layer, wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation;

a first portion of the substrate is characterized by a first cross-sectional shape;

a second portion of the substrate is characterized by a second cross-sectional shape;

the first cross-sectional shape and the second cross-sectional shape are different.

44. The method of claim 43 wherein the first cross-sectional shape is planar and the second cross-sectional shape has at least one arcuate side.

45. A method for forming a patterned layer from a common layer in a photovoltaic application, wherein the patterned layer is configured to form one or more electrically isolated layers of material on a substrate, the method comprising:

making a first laser beam pass with a first laser beam over a first area on the common layer;

based on the step of making a first pass, removing a first amount of the common layer;

making a second laser beam pass with a second laser beam over a second area on the common layer, wherein the second area on the common layer is approximately the same as the first area on the common layer, based on the step of making a second pass, removing a second amount of the common layer, the second amount of the common layer comprising either: a) portions of the common layer left after the first pass, or b) remnants of the first amount that resettle within the area; wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation; and all or a portion of the substrate is a rigid tube or a rigid solid rod.

46. A method for forming a patterned layer from a common layer in a photovoltaic application, wherein the patterned layer is configured to form one or more electrically isolated layers of material on a substrate, the method comprising:

making a first laser beam pass with a first laser beam over a first area on the common layer;

based on the step of making a first pass, removing a first amount of the common layer;

making a second laser beam pass with a second laser beam over a second area on the common layer, wherein the second area on the common layer is approximately the same as the first area on the common layer, based on the step of making a second pass, removing a second amount of the common layer, the second amount of the common layer comprising either: a) portions of the common layer left after the first pass, or b) remnants of the first amount that resettle within the area; wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation; and all or a portion of the substrate is characterized by a circular cross-section, an ovoid cross-section, a triangular cross-section, a pentangular cross-section, a hexagonal cross-section, a cross-section having at least one arcuate portion, or a cross-section having at least one curved portion.

47. A method for forming a patterned layer from a common layer in a photovoltaic application, wherein the patterned layer is configured to form one or more electrically isolated layers of material on a substrate, the method comprising:

making a first laser beam pass with a first laser beam over a first area on the common layer;

based on the step of making a first pass, removing a first amount of the common layer;

making a second laser beam pass with a second laser beam over a second area on the common layer, wherein the second area on the common layer is approximately the same as the first area on the common layer, based on the step of making a second pass, removing a second amount of the common layer, the second amount of the common layer comprising either: a) portions of the common layer left after the first pass, or b) remnants of the first amount that resettle within the area; wherein the first pass provides a first level of electrical isolation between a first portion and a second portion of the common layer;

the second pass provides a second level of electrical isolation between the first portion and the second portion of the common layer, the second level of electrical isolation being greater than the first level of electrical isolation;

a first portion of the substrate is characterized by a first cross-sectional shape;

a second portion of the substrate is characterized by a second cross-sectional shape; and the first cross-sectional shape and the second cross-sectional shape are different.

48. The method of claim 47, wherein the first cross-sectional shape is planar and the second cross-sectional shape has at least one arcuate side.

* * * * *